United States Patent [19]
Schulze et al.

[11] Patent Number: 5,557,197
[45] Date of Patent: Sep. 17, 1996

[54] MULTIMETER WITH AUTOMATIC FUNCTION-SETTING

[75] Inventors: Wolfgang Schulze, Nuremberg; Dieter Feulner, Wendelstein; Burkhard Krien, Roth; Bernd Meier, Postbauer-Heng, all of Germany

[73] Assignee: Gossen-Metrawatt GmbH, Nuremberg, Germany

[21] Appl. No.: 305,954

[22] Filed: Sep. 16, 1994

[30] Foreign Application Priority Data

Sep. 18, 1993 [DE] Germany ............... 43 31 796.0

[51] Int. Cl.⁶ ............................................. G01R 15/08
[52] U.S. Cl. ............................................ 324/115; 324/713
[58] Field of Search ................................ 324/115, 73.1, 324/713; 364/481, 483

[56] References Cited

U.S. PATENT DOCUMENTS 5,027,057  6/1991  Mageland ........................ 324/115
5,144,154  9/1992  Banaska ........................... 324/115
5,250,893  10/1993  Gambill .......................... 324/115

FOREIGN PATENT DOCUMENTS

0435431A2  7/1991  European Pat. Off. .
0487174A2  5/1992  European Pat. Off. .

Primary Examiner—Ernest F. Karlsen
Assistant Examiner—Russell M. Kobert
Attorney, Agent, or Firm—Bacon & Thomas

[57] ABSTRACT

A multimeter with automatic measurement function setting and automatic recognition of measurement range includes circuitry having a high input resistance for carrying out the recognition of the type of electrical parameter to be measured. When the parameter being measured is recognized as an impedance, however, a low input resistance is automatically switched on, whereupon the magnitude of the impedance is measured at low input resistance and then is displayed, and if the range of measurement changes, the measurement procedure is repeated from the beginning.

7 Claims, 11 Drawing Sheets

MULTIMETER WITH AUTOMATIC FUNCTION-SETTING

BACKGROUND OF THE INVENTION

1. Field of the Invention

The present invention concerns digital multimeters, and in particular hand-held multimeters, which are able to perform a plurality of functions such as measuring voltage, resistance, capacitance and current, and which furthermore include automatic range setting and automatic function setting capabilities.

2. Description of Related Art

European patent document 0 435 431 discloses a state-of-the-art multimeter with automatic function setting for testing respective voltages or resistances of, for example, diodes. A signal recognition circuit is appropriately provided at the input of the multimeter to detect an analog signal, transmit its features in the form of logic signals to a transformation circuit which carries out an appropriate transformation function, and then display the measured, transformed value in response to the analog input signal.

A further development in multimeters with automatic function-setting is described in European patent document 0 487 174, in which a controller is provided for controlling both an A/D converter and a signal-recognition circuit. The apparatus proposed in European patent document 0 487 174 is faster, simpler, and also more economical to manufacture than the above described state-of-the-art device.

The automatic function multimeters of the state of the art use a comparatively low input resistance to measure both impedances and voltages. In many instances, however, the low-resistance measurement of voltage may be a problem because of loading of the voltage source being measured, which can possibly lead to errors. To minimize such measurement errors, digital multimeters as a rule have an input resistance on the order of 10 Megohms. In such multimeters, the measurement function so far has been set manually using a function switch.

SUMMARY OF THE INVENTION

It is an objective of the invention to provide circuitry for digital multimeters with automatic function setting which can be manufactured simply and economically and which allows accurate measurement of different electrical characteristics of a signal or device over a wide range of values.

This objective is achieved according to a preferred embodiment of the invention, by a method for automatically recognizing or identifying and measuring the magnitudes of the different electrical parameters which make up the signal or device being tested (current, voltage, resistance/impedance, and capacitance) in a multimeter with automatically selected value ranges, and in which the magnitude of the input is detected by an input recognition circuit in such a manner that the recognition of magnitude to be measured takes place at a high input impedance, and further in that if the magnitude is recognized as being an impedance, a low input resistance is switched on, so that the magnitude is measured at low resistance and then is displayed, and that in the case of a change in measurement range, the measurement procedure is repeated from the beginning. Where appropriate, resistances and capacitances are measured as impedances in the proposed method.

In addition, as will be recognized by those skilled in the art, the proposed method may be part of a more complete measurement procedure preferably being carried out by computerized process control.

In a further preferred embodiment of the invention, an apparatus is provided for automatically recognizes and measuring electrical magnitudes by providing a switch system which automatically switches from high to low input resistance in relation to the recognized measurement magnitude, which preferably is an impedance. The switch system preferably includes a bistable relay and at least two CMOS switches. As already indicated with respect to the above described preferred method, the switch system advantageously may be process-controlled by a computer. In addition, the essential circuit components are preferably consolidated into one CMOS integrated circuit to facilitate economic manufacture of the proposed circuit.

In yet another aspect of the invention, the above described circuit is used in a multimeter with automatic function setting and automatic selection of measurement range. The multimeter itself may be conventional, except as otherwise noted, and for example may be equipped with a manual function selector besides the automatic function selection of the invention.

DETAILED DESCRIPTION OF THE PREFERRED EMBODIMENTS

Figure 1:
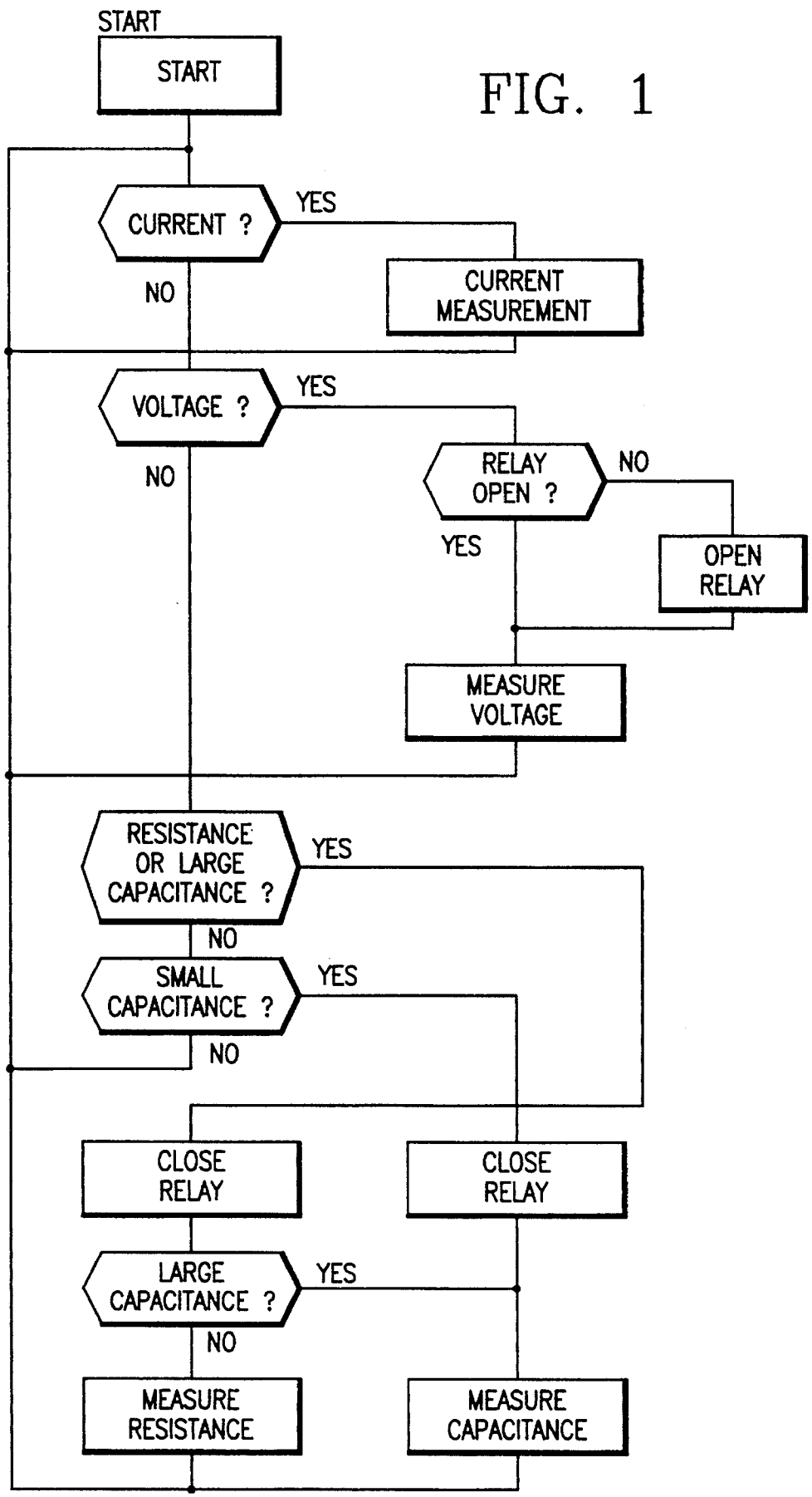
FIG. 1 is a flowchart of a measurement method according to a preferred embodiment of the invention.

FIG. 1 illustrates a procedure for function selection which is part of the preferred measurement procedure. Specific criteria are applied in each step to determine whether a given type of electrical parameter is present. If so, the magnitude of the parameter is measured as precisely as possible using known methods of automatic selection of the measurement range and then is displayed. The particular measurement function that was selected is retained until the range of measurement changes. Thereupon, the classification of the parameter being measured begins again.

Initially, in the implementation shown in FIG. 1, the presence of a current is checked, and if a current is present, the current is measured and displayed until there is a change in the measurement range. Thereupon, the measurement procedure is renewed and, if no current passes through the current terminal, a voltage check at the input terminals is performed. If a voltage is present, the position of a relay is checked and if called for the relay is switched into the high-resistance voltage position (open position). Thereupon, the voltage measurement continues until no more voltage is detected, after which the measurement procedure returns to its starting point in which the presence of a current is checked.

If no voltage is present, a resistance or a large capacitance is sought. If either a resistance or large capacitance is present, the relay is closed, i.e., it is switched to a low input resistance position. Once the relay is closed, the presence of a large capacitance is checked. If the large capacitance is present, it is measured. If not, the resistance will be measured. The measurements are repeated until the measurement range changes. In the event of a change in measurement range, the function selection begins again.

If neither a resistance nor a large capacitance is present, the presence of a small capacitance is checked. If found, the relay is closed and the capacitance is measured and displayed. The measurement is repeated until the measurement range changes, after which the function selection is repeated.

Figure 2:
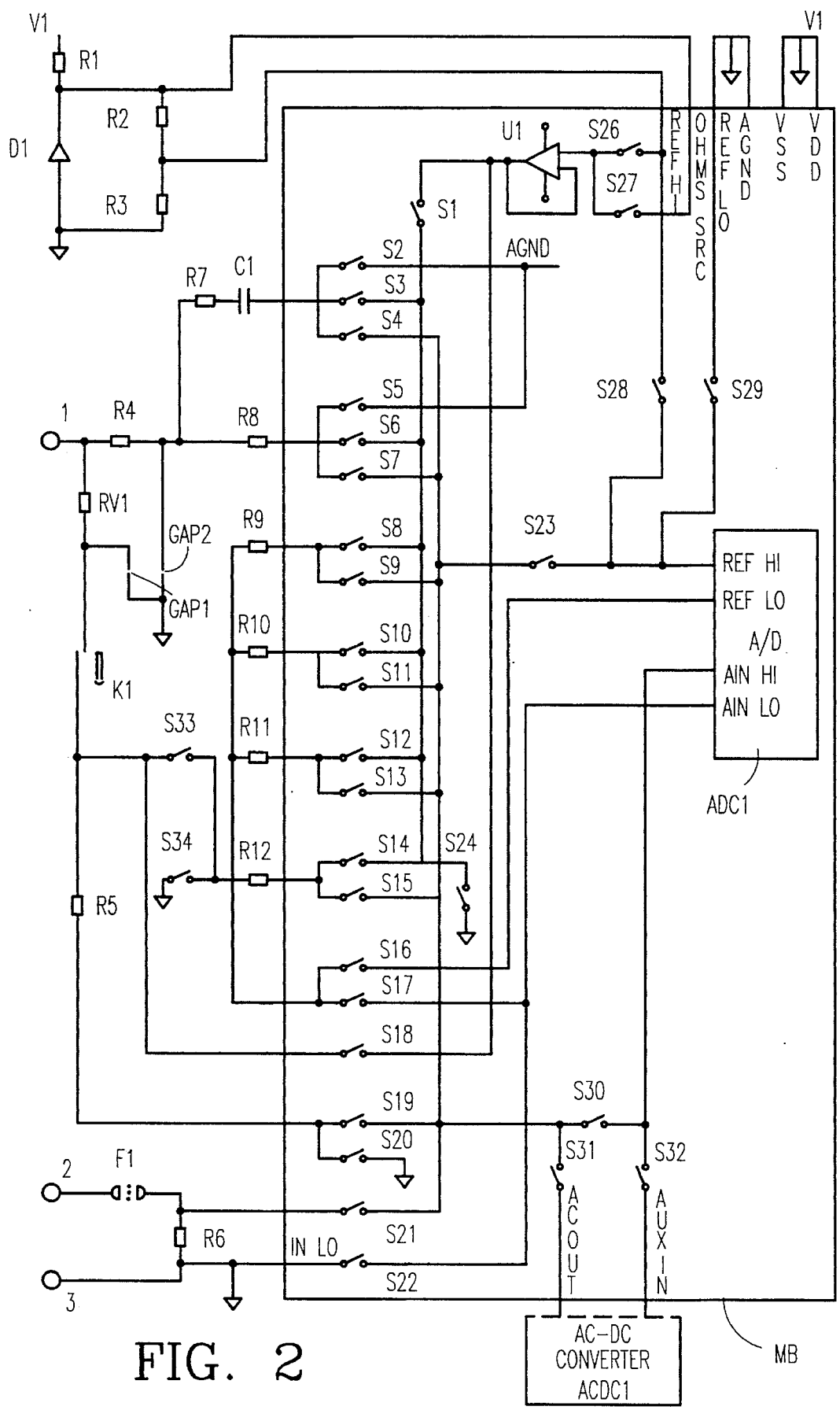
FIG. 2 is a circuit diagram showing the apparatus of a preferred embodiment of the invention.

FIG. 2 is a circuit diagram showing the preferred apparatus, which is in the form of a multimeter having three input terminals, including a terminal 1 for voltage, resistance and capacitance (impedance) measurements, an input terminal 2 for current measurements, and an input terminal 3 for reference.

A resistor R4 together with a discharge gap GAP2 protects the voltage input path against high-energy voltage peaks, while a PTC resistor RV1 together with a discharge gap GAP 1 protects the impedance measuring path, and a fuse F1 protects the current measuring path.

A reference voltage for an A/D converter ADC1 is generated by means of a zener diode D1 and a voltage divider R2, R3 and is applied through the switches S28, S29 to the reference voltage inputs of the A/D converter. A/D converter ADC1 is a conventional analog-to-digital converter preceded by a filter.

A voltage measurement path passes through resistors R4 and R8 and through switch S6 for DC measurements, and through resistors R4 and R7, capacitor C1, and switch S3 for AC measurements, and thereafter through one of the voltage divider resistors R9–R12 and switch S34 to a reference point. Because the electric switches include contact resistances which cannot be neglected, voltage taps are present at the voltage divider resistors and at the reference point. A DC measurement signal passes through a voltage tap and a switch S30, while an AC signal passes through a switch S31, a rectifier ACDC1 and a switch S32 to A/D converter ADC1. The reference voltage tap is implemented through a switch S17. The rectifier ACDC1 used here is a commercially available AC to DC converter, for instance type AD636, with a pre-mounted chopper-buffer.

An impedance measurement path passes through the PTC resistor RV1, a relay K1 and a switch S33 to the reference resistors R9 through R12 one of which, depending on the range, is switched into the path. The voltage drop across the particular reference resistor can be tapped through switches S23 and S16 to the AD converter ADC1. The voltage drop across the resistor to be measured can be tapped through the switches S19 and S22.

A current measurement path passes through the fuse F1 and a shunt resistor R6. The voltage taps are applied via switches S21 and S22 through the DC and AC voltage paths respectively, as required by the voltage measurement procedure, to A/D converter ADC1.

A microprocessor (not shown) controls the A/D converter ADC1 and each of the illustrated switches. A number of input protective devices for the multimeter IC, additional support capacitors and smoothing capacitors, a power supply, a manual keyboard, and a display are also included in the preferred embodiment but are conventional and easily implemented by those skilled in the art and therefore not shown.

Figure 3:
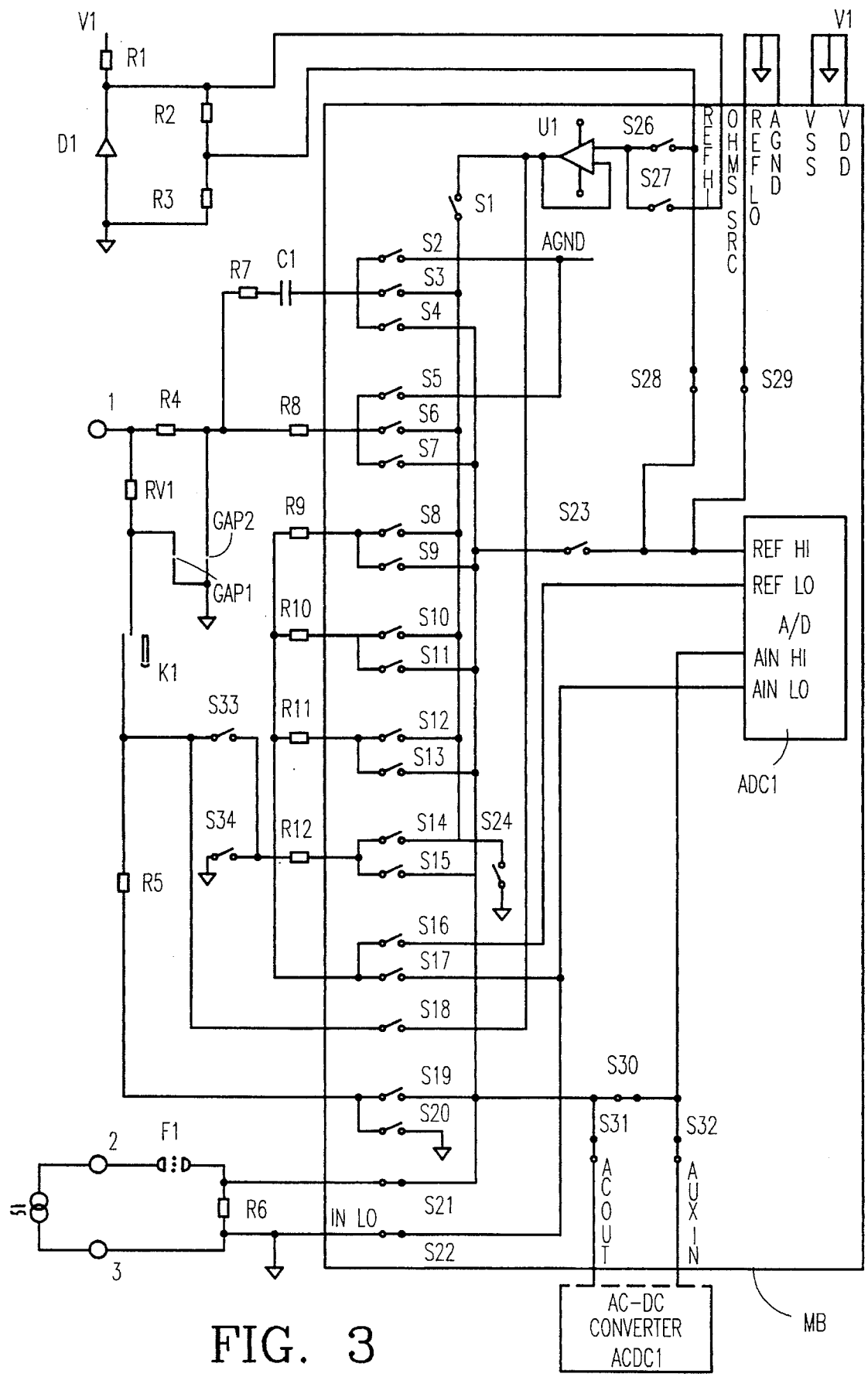
FIG. 3 is a circuit diagram showing the apparatus of FIG. 2 in the process of recognizing currents.

FIG. 3 is a circuit diagram illustrating the configuration of the apparatus of FIG. 2 for the case of current recognition. In this case, the relay K1 can be either open or closed. The current to be measured is converted into a DC voltage portion by means of the shunt resistor R6 and passed through the switches S21 and S30, while the AC voltage portion passes through the switches S21 and S31, the rectifier ACDC1, and the switch 32, to reach the positive input of A/D converter ADC1. The negative input of the A/D converter is connected through the switch S22 to the reference point. The reference for the A/D converter ADC1 is connected through the switch S28 to a positive reference signal input REF HI and through the switch S29 to a negative reference voltage input REF LO, and to the reference point. The above-mentioned microprocessor (not shown) controls the switches in such a manner that first a measurement of DC current, and then a measurement of AC current is performed.

Figure 4:
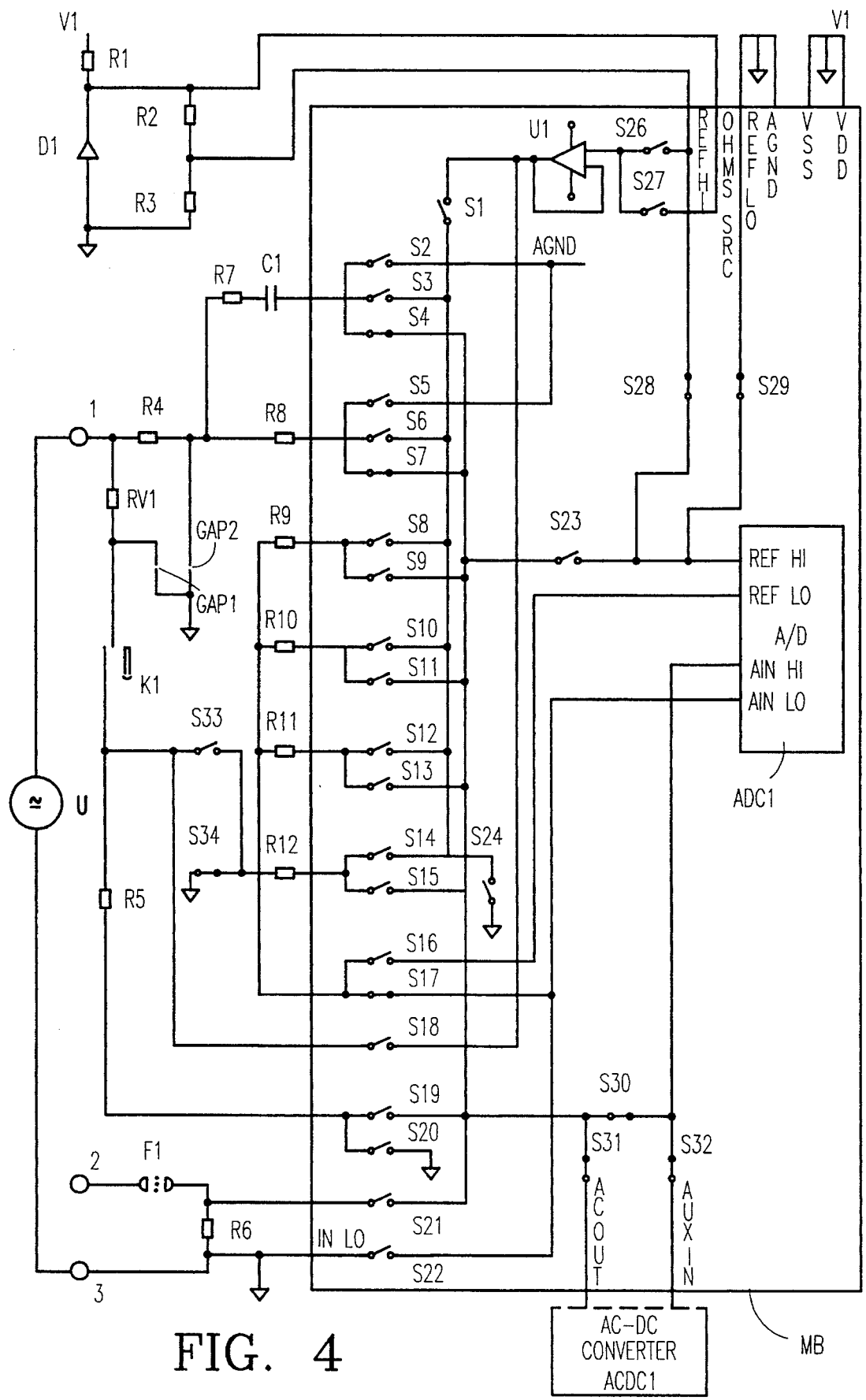
FIG. 4 is a circuit diagram showing the apparatus of FIG. 2 when recognizing voltages.

FIG. 4 is a circuit diagram showing the configuration of the apparatus of FIG. 2 in the event of voltage recognition. In this case, relay K1 again can be open or closed. A DC portion of the voltage to be measured passes through the resistors R4 and R8 and through the switches S7 and S30, while an AC voltage portion passes through the resistors R4 and R7, a capacitor C1 and switches S4 and S31, the rectifier ACDC1, and the switch S32, to reach the positive input of the A/D converter ADC1. The negative input of the A/D converter is connected through the switches S17 and S34 to the reference point. The reference of the A/D converter is connected through the switch S28 to the positive reference voltage input REF HI and through the switch S29 to the negative reference voltage input REF LO, and to the reference point. The microprocessor controls the switches in such a manner that first a measurement of DC voltage and then a measurement of AC voltage is carried out.

Figure 5:
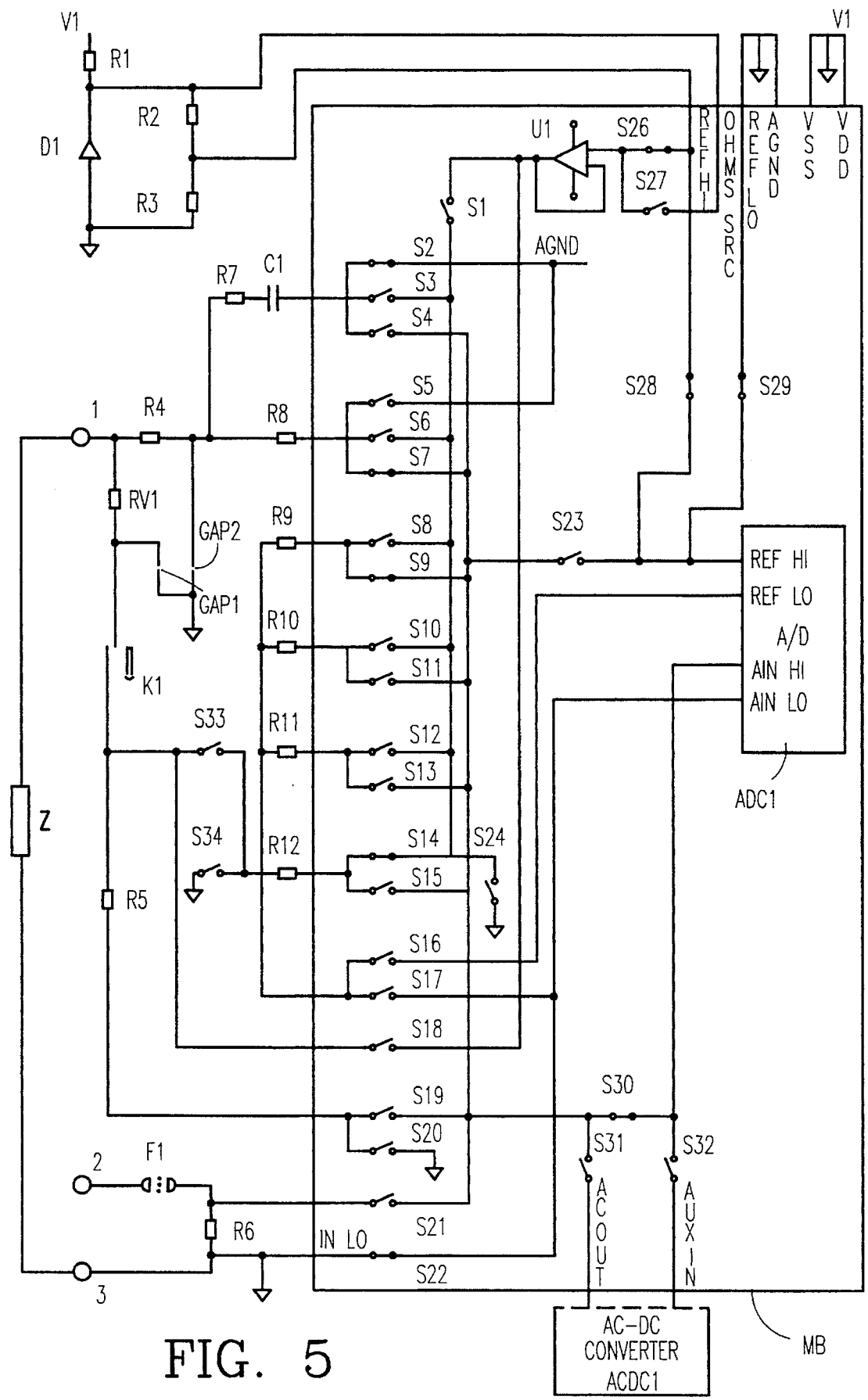
FIG. 5 is a circuit diagram showing the apparatus of FIG. 2 when recognizing impedances, i.e., large capacitances.

FIG. 5 is a circuit diagram of the apparatus of FIG. 2 for the case of recognizing resistances or for recognizing large capacitances. The reference voltage REF HI is applied through a switch S26, a voltage follower U1, switches S1 and S14, resistors R12 and R9, switch S7, and resistors R8 and R4, to the input terminal 1. After a predetermined time, the voltage across resistor R9 is measured via switches S9 and S30 at AIN HI, and via switch S22 at AIN LO of the A/D converter ADC1. If no impedance is applied, or a small capacitor already charged at the time of measurement is present, the voltage equals the reference voltage. If the voltage is less than the reference voltage, a resistor or a large capacitor is present.

Figure 6:
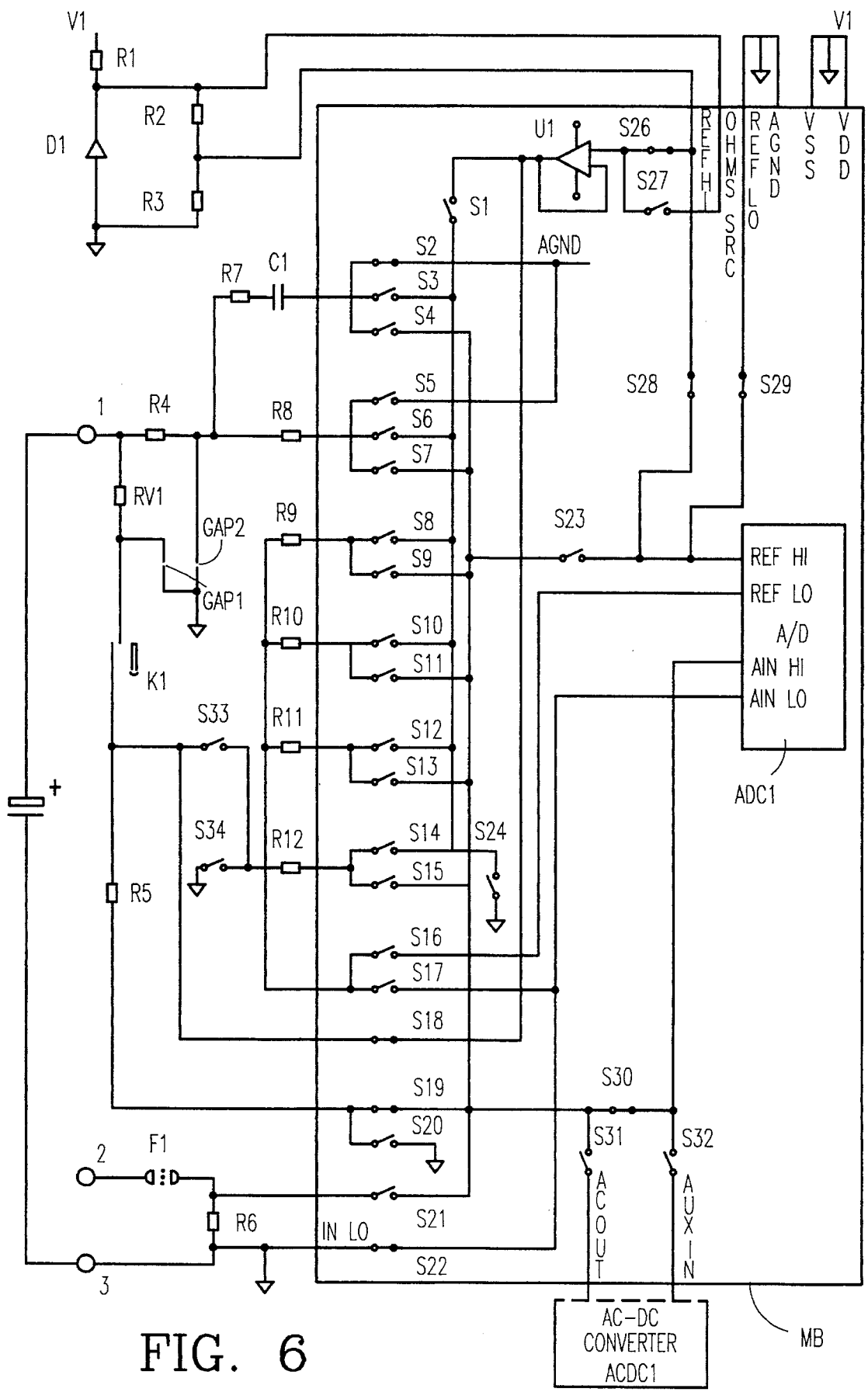
FIG. 6 is a circuit diagram showing the apparatus of FIG. 2 when recognizing large capacitances.

FIG. 6 is a circuit diagram of the apparatus of FIG. 2 configured for recognizing large capacitances. In this case, relay K1 is closed and the reference voltage REF HI is now applied through the switch S26, voltage follower U1, a switch S18 and the relay K1 to the input terminal 1. After a short time interval, the switch S18 opens. During this short time interval the voltage at the capacitor is measured twice by means of the PTC resistor RV1 and further via input through relay K1, resistor R5, and switches S19 and S30 to AIN Hi, and through the switch S22 on AIN LO. If a capacitance is present, the voltage values will be approximately equal, whereupon the capacitance is measured in a capacitance measurement procedure.

Figure 7:
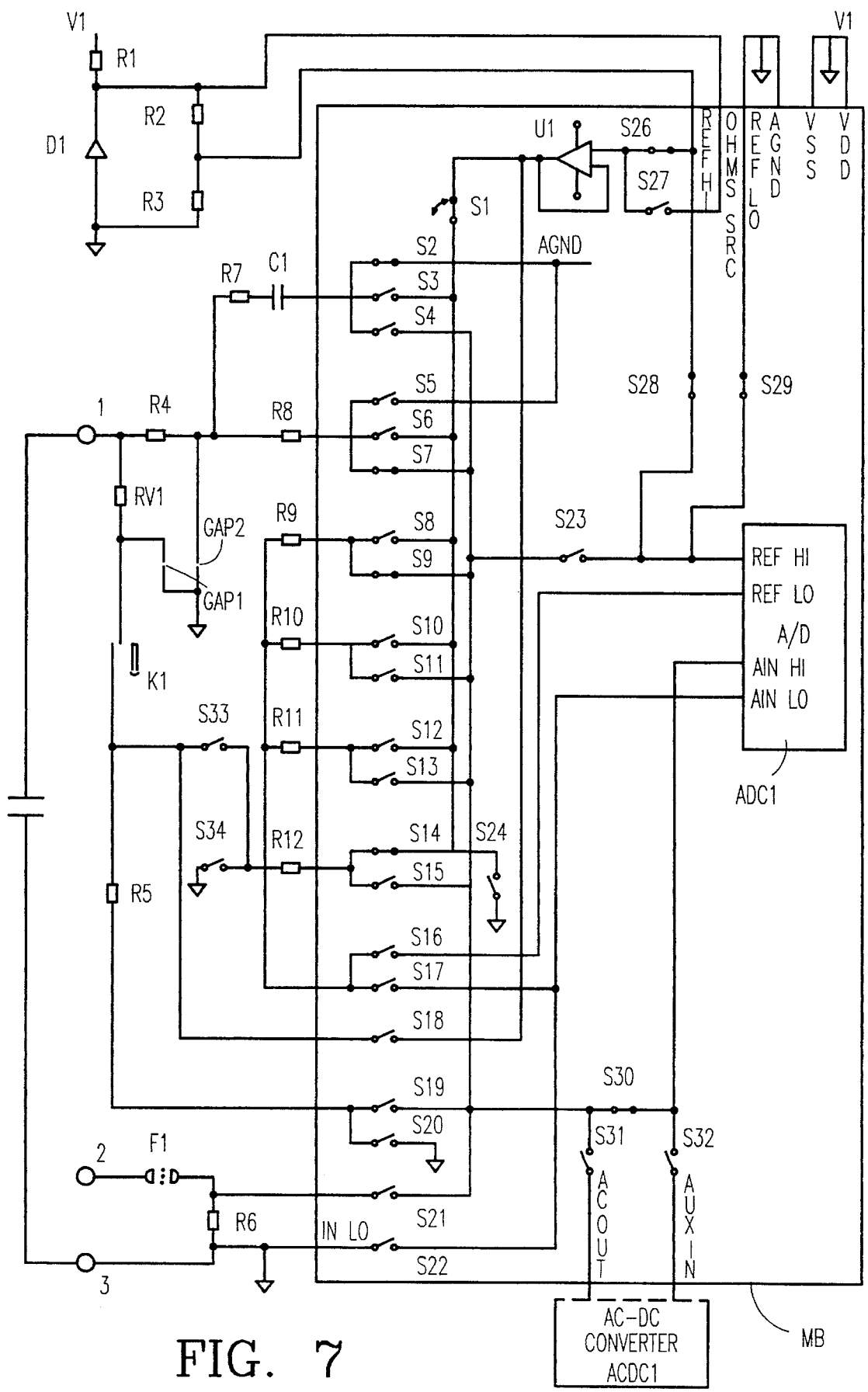
FIG. 7 is a circuit diagram showing the apparatus of FIG. 2 when recognizing small capacitances.

FIG. 7 is a circuit diagram of the apparatus of FIG. 2 when small capacitances are being recognized. The reference voltage REF HI is applied through the switch S26, the voltage follower U1, and through switches S1 and S14, resistors R12 and R9, switches S9 and S7, and resistors R8 and R4 to the input terminal 1. The voltage after the resistor R9 is measured through S9, S30 at AIN HI and through S22 at AIN LO. If no impedance is applied, or if only a small capacitor already charged at the time of measurement is present, the voltage equals the reference voltage. The driving voltage is shut off through the switch S1 and measurement is carried out again. If a capacitor is present, the two test values are approximately equal. Thereupon, the relay K1 is closed and capacitance measurement is performed.

Figure 8:
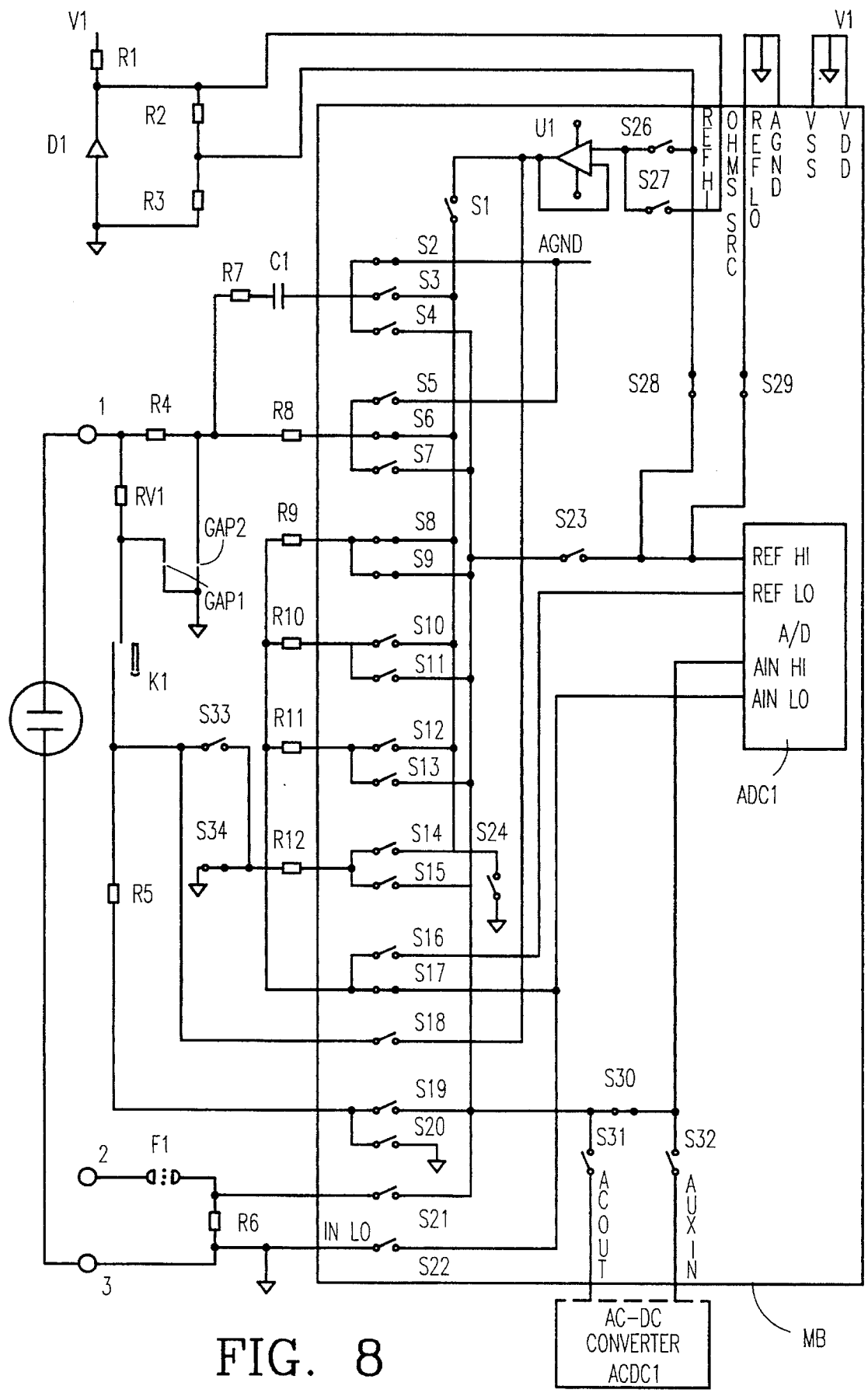
FIG. 8 is a circuit diagram showing the apparatus of FIG. 2 when measuring DC voltages.

FIG. 8 is a circuit diagram of the apparatus of FIG. 2 when measuring DC voltages. Relay K1 can be either open or closed in this situation because the signal being measured passes through the resistors R4 and R8 and through the switch S6 to arrive at the center tap of the voltage divider. In this instance, the voltage at the voltage divider R9 is tapped through the switch S9 and fed through the switch S30 to the A/D converter ACDC1. AIN LO is connected through the switches S34 and S17. The reference voltage passes through S28 and S29 to the A/D converter.

Figure 9:
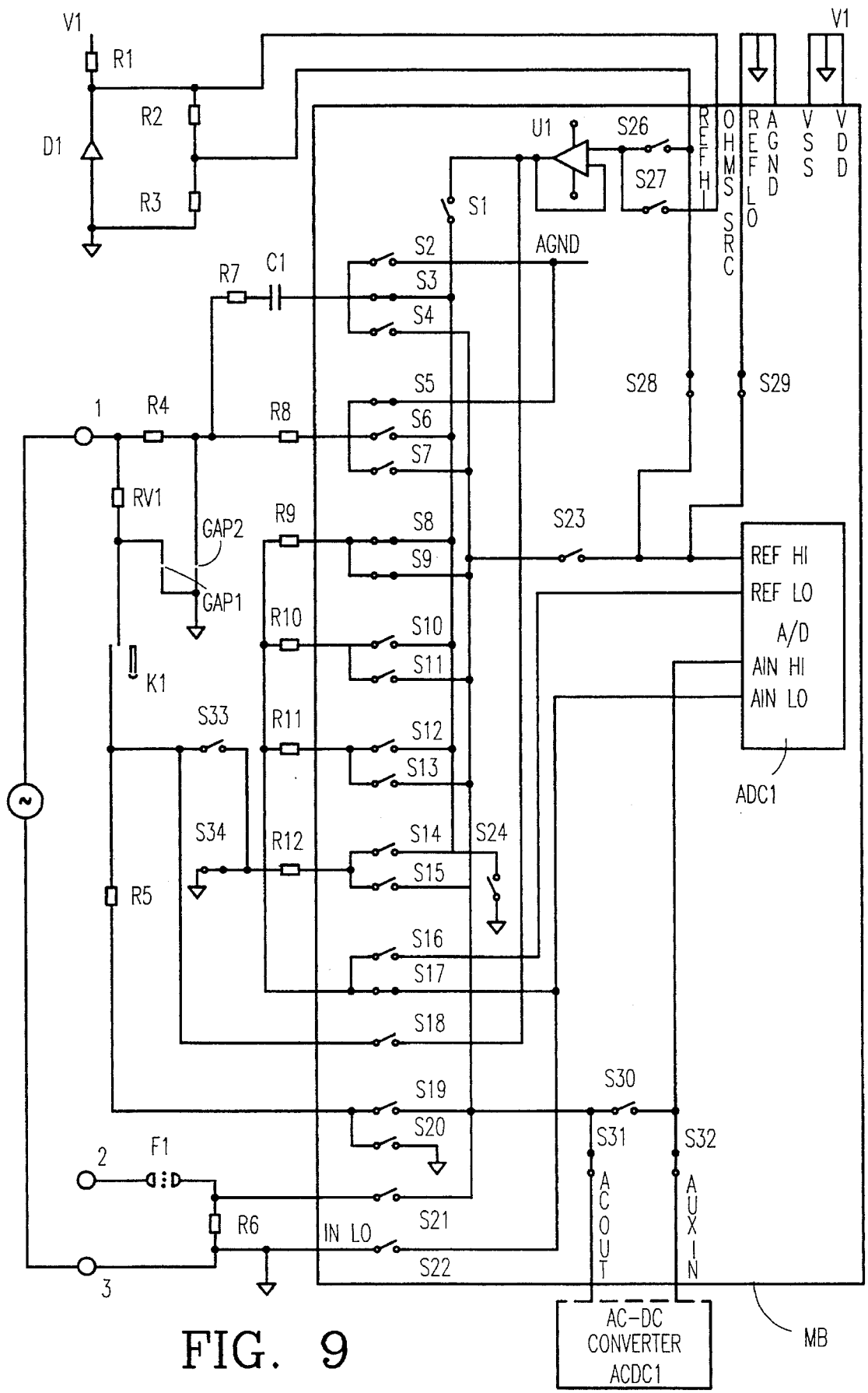
FIG. 9 is a circuit diagram showing the apparatus of FIG. 2 when measuring AC voltages.

FIG. 9 is a circuit diagram of the apparatus of FIG. 2 when measuring AC voltages, wherein the relay K1 also can be either open or closed, and the signal to be analyzed passes through the resistors R4 and R7, the capacitor C1, and the switch S2 to the center tap of the voltage divider. In this instance, the voltage-divider resistor R9 is connected through the switches S8 and S34. The voltage at the voltage divider is tapped through switch S9 and fed through the switch S31, the rectifier ACDC1 and the switch S32 to the A/D converter. Input IN LO is connected through the switches S34 and S17, while the reference voltage passes through the switches S28 and S29 to the A/D converter.

Figure 10:
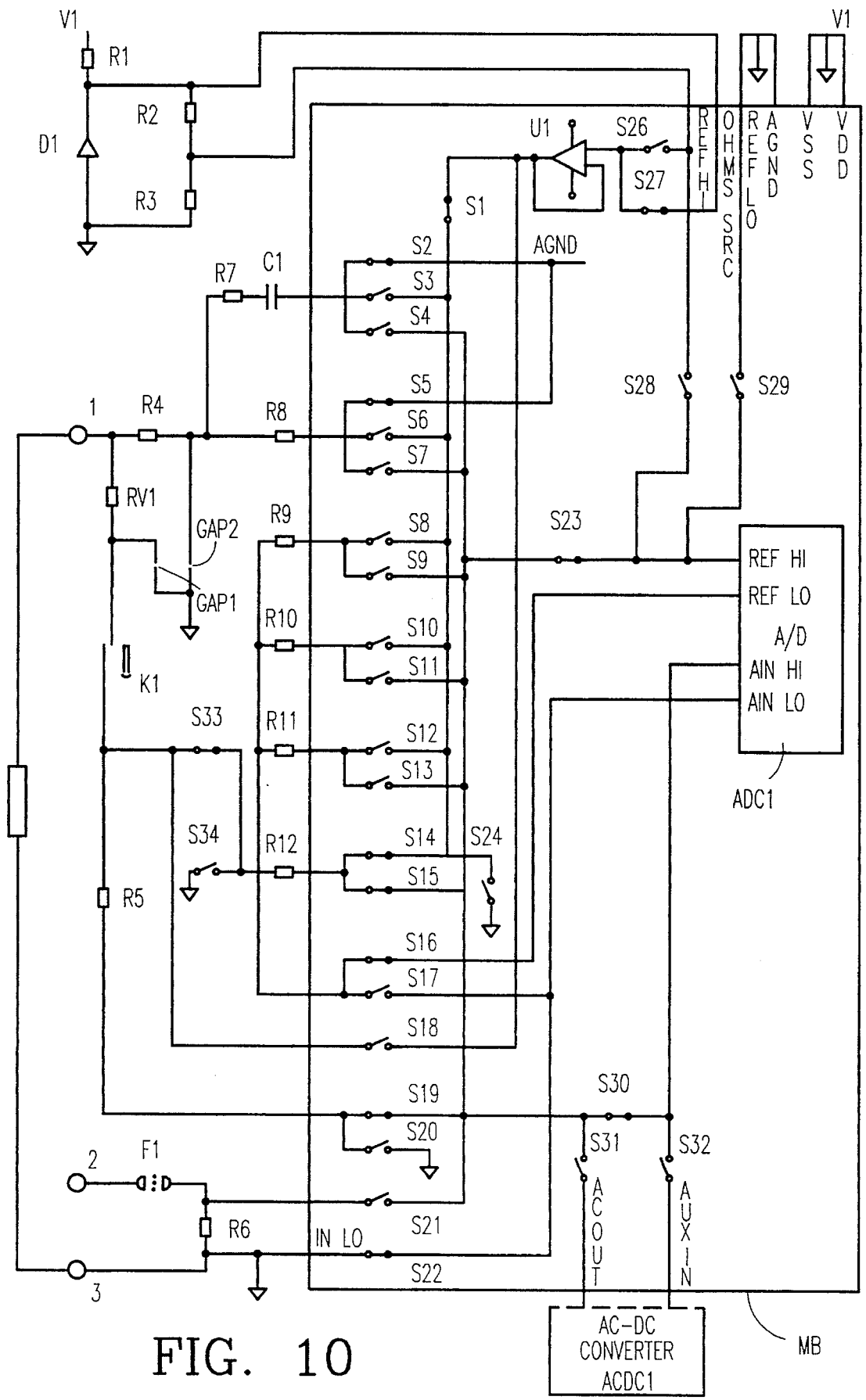
FIG. 10 is a circuit diagram showing the apparatus of FIG. 2 when measuring impedances.

FIG. 10 is a circuit diagram of the apparatus of FIG. 2 when measuring resistances. The known ratio method is employed in this case. Relay K1 is closed and the resistance voltage OHMS SRC passes through a switch S27, the voltage follower U1, and the switch S1 to arrive at a reference resistance bus. In this instance, the resistor R12 is inserted by means of the switch S14. The current also passes through switch S33, relay K1, PTC resistor RV1, and the corresponding terminal through the resistor to be measured, to the reference potential. The voltage applied to the reference resistor is tapped through the switch S15 and a switch S16 and is fed through a switch S23 to reference voltage REF HI and directly to reference voltage REF LO of the A/D converter. The voltage drop at the resistor is tapped through relay K1, resistor R5, switches S19 and S30 with respect to AIN HI and through the switch S22 with respect to AIN LO. The A/D converter carries out a measurement the result of which is directly proportional to the ratio of reference resistance to resistance being measured.

Figure 11:
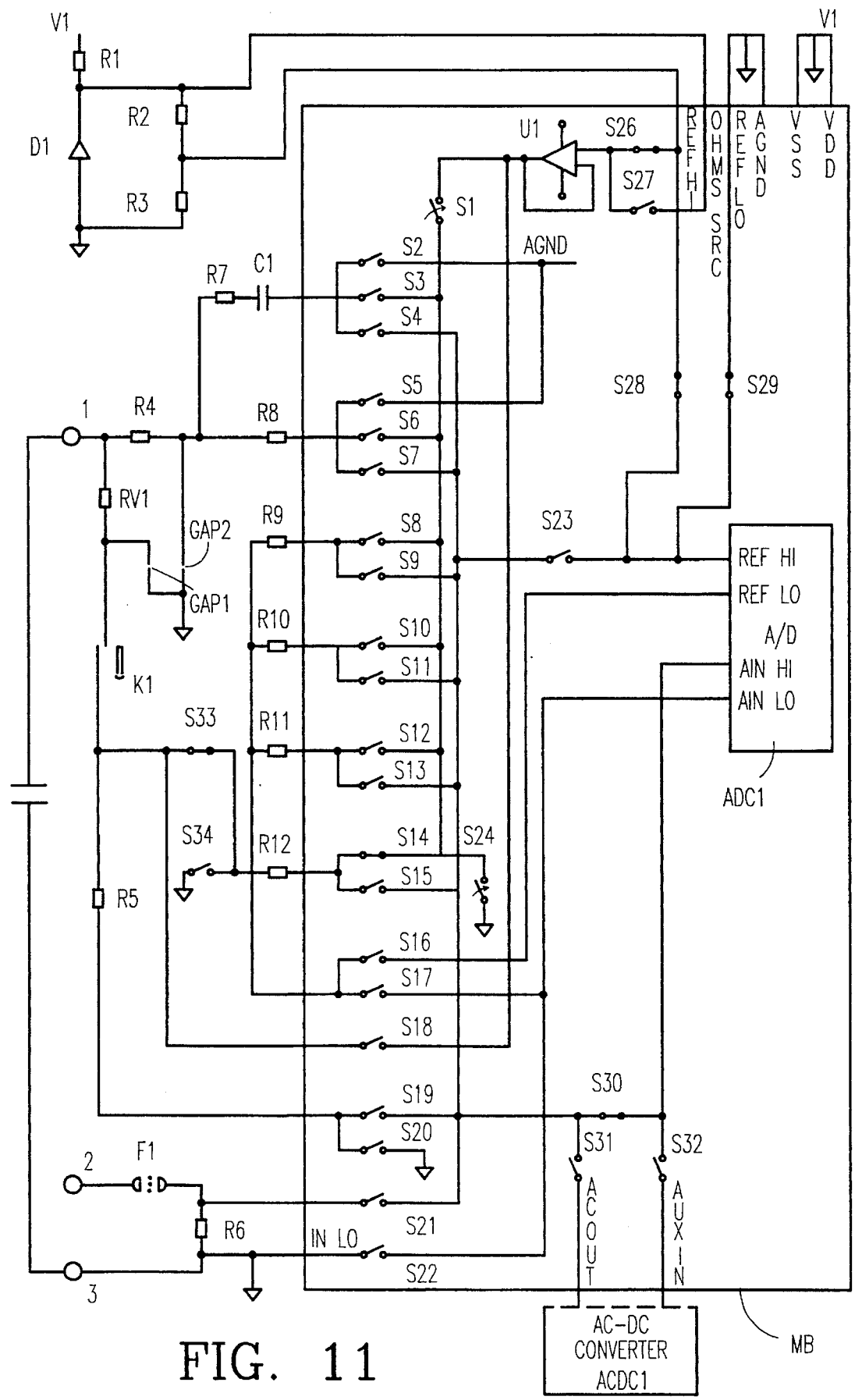
FIG. 11 is a circuit diagram showing the apparatus of FIG. 2 when measuring capacitances.

FIG. 11 is a circuit diagram of the apparatus of FIG. 2 for capacitance measurements. Relay K1 is closed and, in the first stage, the external capacitor is discharged through resistor RV1, relay K1, switch S33, resistor R12, and switches S14 and S24. Next, the capacitor is charged through reference voltage REF HI, switch S26, voltage follower circuit U1, switches S1 and S14, resistor R12, switch S33, relay K1, and PTC resistor RV1. At the same time, the current-proportional voltage drop is integrated through resistor R12 by means of the AIN HI path through switches S15 and S30 and the AIN LO path 17 at the A/D converter ADC1. Thereupon, the charging voltage is shut off through S1 and the capacitor voltage is measured through PTC resistor RV1, relay K1, resistor R5, switches S19 and S30 at AIN HI, and switch S22 at AIN LO. The capacitance is directly proportional to the ratio of integrated current to measured voltage.

Having thus described a particular preferred embodiment of the invention with sufficient particularity to enable one skilled in the art to make and use the invention, it will be appreciated that variations and modifications of the embodiment described above and shown in the drawings can still be made without departing from the spirit and scope of the invention, and thus that the invention should not be limited by the description and illustrations of the preferred embodiment, but rather should be interpreted solely in accordance with the appended claims.

We claim:

1. In a method for the automatic recognition of electrical characteristics and measurement of the magnitudes thereof in a multimeter with automatically selected ranges of measurement, the characteristics being recognized by a recognition circuit present at an input to the multimeter, comprising the steps of:

(a) identifying an electrical characteristic whose magnitude is to be measured by applying an input signal to a high input resistance via input terminals;

(b) automatically switching on a low input resistance when the characteristic being measured is recognized as an impedance;

(c) measuring the magnitude of said impedance at low input resistance; and (d) repeating steps (a)–(c) when the range of measurement is changed, the improvement wherein the low input resistance is switched only when a voltage applied at the input terminals is zero, and wherein the high input resistance is switched on again only after a voltage is applied to the input terminals.

2. A method as claimed in claim 1, wherein step (a) includes the following steps:

(a1) performing a high input resistance check to determine whether current is present and, if so, measuring the current and displaying a result of the current measurement;

(a2) performing a high input resistance check to determine whether a voltage is present and, if so, checking a position of a switch system for switching from high to low input resistance and if the switch system is switched to a low input resistance, switching the switch system to a high input resistance, and then measuring the voltage and displaying a result of the voltage measurement;

(a3) performing a high input resistance check to determine whether a resistor or a large capacitor is present and, if so, switching said switch system to the low input resistance and checking whether a large capacitance is present and, if a large capacitance is present, measuring the large capacitance and displaying a result of the large capacitance measurement and, if a large capacitance is not present, measuring the resistance and displaying a result of the resistance measurement;

(a4) performing a high input resistance check to determine whether a low capacitance is present and, if so, switching said switch system to the low input resistance, measuring the low capacitance and displaying a result of the low capacitance measurement.

3. A method as claimed in claim 1, wherein the high input resistance is switched on again only after a voltage is applied to the input terminals.

4. A method as claimed in claim 1, wherein step (a) includes the following steps:

(a1) performing a high input resistance check to determine whether current is present and, if so, measuring the current and displaying a result of the current measurement;

(a2) performing a high input resistance check to determine whether a voltage is present and, if so, checking a position of a switch system for switching from high to low input resistance and if the switch system is switched to a low input resistance, switching the switch system to a high input resistance, and then measuring the voltage and displaying a result of the voltage measurement;

(a3) performing a high input resistance check to determine whether a resistor or a large capacitor is present and, if so, switching said switch system to the low input resistance and checking whether a large capacitance is present and, if a large capacitance is present, measuring the large capacitance and displaying a result of the large capacitance measurement and, if a large capacitance is not present, measuring the resistance and displaying a result of the resistance measurement;

(a4) performing a high input resistance check to determine whether a low capacitance is present and, if so, switching said switch system to the low input resistance, measuring the low capacitance and displaying a result of the low capacitance measurement.

5. A method as claimed in claim 1, wherein resistors and capacitors are measured as impedances.

6. A method as claimed in claim 5, wherein step (a) includes the following steps:

(a1) performing a high input resistance check to determine whether current is present and, if so, measuring the current and displaying a result of the current measurement;

(a2) performing a high input resistance check to determine whether a voltage is present and, if so, checking a position of a switch system for switching from high to low input resistance and if the switch system is switched to a low input resistance, switching the switch system to a high input resistance, and then measuring the voltage and displaying a result of the voltage measurement;

(a3) performing a high input resistance check to determine whether a resistor or a large capacitor is present and, if so, switching said switch system to the low input resistance and checking whether a large capacitance is present and, if a large capacitance is present, measuring the large capacitance and displaying a result of the large capacitance measurement and, if a large capacitance is not present, measuring the resistance and displaying a result of the resistance measurement;

(a=b 4) performing a high input resistance check to determine whether a low capacitance is present and, if so, switching said switch system to the low input resistance, measuring the low capacitance and displaying a result of the low capacitance measurement.

7. A method as claimed in claim 1, wherein step (a) includes the following steps:

(a1) performing a high input resistance check to determine whether current is present and, if so, measuring the current and displaying a result of the current measurement;

(a2) performing a high input resistance check to determine whether a voltage is present and, if so, checking a position of a switch system for switching from high to low input resistance and if the switch system is switched to a low input resistance, switching the switch system to a high input resistance, and then measuring the voltage and displaying a result of the voltage measurement;

(a3) performing a high input resistance check to determine whether a resistor or a large capacitor is present and, if so, switching said switch system to the low input resistance and checking whether a large capacitance is present and, if a large capacitance is present, measuring the large capacitance and displaying a result of the large capacitance measurement and, if a large capacitance is not present, measuring the resistance and displaying a result of the resistance measurement;

(a4) performing a high input resistance check to determine whether a low capacitance is present and, if so, switching said switch system to the low input resistance, measuring the low capacitance and displaying a result of the low capacitance measurement.

* * * * *